(12) United States Patent
Park

(10) Patent No.: US 6,824,618 B2
(45) Date of Patent: Nov. 30, 2004

(54) SUBSTRATE RECEIVING APPARATUS AND METHOD THEREOF

(75) Inventor: Kap Ryol Park, Taegu-kwangyokshi (KR)

(73) Assignee: LG.Philips LCD., Ltd., Seoul (KR)

( * ) Notice: Subject to any disclaimer, the term of this patent is extended or adjusted under 35 U.S.C. 154(b) by 47 days.

(21) Appl. No.: 10/286,763

(22) Filed: Nov. 4, 2002

(65) Prior Publication Data

US 2003/0111177 A1 Jun. 19, 2003

(30) Foreign Application Priority Data

Dec. 19, 2001 (KR) .......................................... 2001-81212

(51) Int. Cl.⁷ .............................................. B65D 85/86
(52) U.S. Cl. ...................... 118/728; 118/719; 414/810
(58) Field of Search ................................ 118/728, 719; 414/810

(56) References Cited

U.S. PATENT DOCUMENTS

| | | | |
|---|---|---|---|
| 5,766,493 A | 6/1998 | Shin | |
| 5,835,176 A | 11/1998 | Jeong et al. | |
| 6,092,981 A | * 7/2000 | Pfeiffer et al. | 414/810 |
| 6,197,209 B1 | 3/2001 | Shin et al. | |
| 6,340,405 B2 | * 1/2002 | Park | 156/345.32 |

FOREIGN PATENT DOCUMENTS

| | | |
|---|---|---|
| JP | 2138459 | 5/1990 |
| JP | 3022390 | 1/1991 |
| JP | 4116619 | 4/1992 |
| JP | 5249422 | 9/1993 |
| JP | 5249423 | 9/1993 |
| JP | 7168172 | 7/1995 |

* cited by examiner

Primary Examiner—Gregory Mills
Assistant Examiner—Sylvia R. MacArthur
(74) Attorney, Agent, or Firm—McKenna Long & Aldridge LLP

(57) ABSTRACT

A substrate receiving apparatus and a method thereof that prevents substrate damage from occurring when a substrate is loaded/unloaded on/from a cassette. The present invention includes a cassette having a plurality of plates inside so as to receive a plurality of substrates; a cassette loading unit uploading/downloading the cassette; a port supporting the cassette loading unit; and a plurality of auxiliary plates inserted inside the cassette from outside. The method includes downloading a cassette so as to move substrates from plates of the cassette to auxiliary plates, unloading and loading the substrates placed on the auxiliary plates from/on the cassette, and uploading the cassette so as to move the substrates from the auxiliary plates to the plates of the cassette.

10 Claims, 8 Drawing Sheets

SUBSTRATE RECEIVING APPARATUS AND METHOD THEREOF

This application claims the benefit of the Korean Application No. P2001-81212 filed on Dec. 19, 2001, which is hereby incorporated by reference for all purposes as if fully set forth herein.

BACKGROUND OF THE INVENTION

1. Field of the Invention

The present invention relates to a substrate receiving apparatus and method thereof that prevents substrate damage from occurring when a substrate is loaded/unloaded on/from a cassette.

2. Discussion of the Related Art

Generally, liquid crystal displays (LCDs) having characteristics of power-saving driving, full color realization, high image quality, and the like are widely used as screens in various devices such as watches, calculators, notebook computers and personal computers.

A process of fabricating such a liquid crystal display device mainly includes a substrate preparing process for constituting a liquid crystal display panel and a module assembly process.

In the related art, while the above-mentioned processes are carried out, a specially constituted substrate receiving apparatus is used for transferring a plurality of substrates and panels.

A substrate receiving apparatus for a liquid crystal display device according to a related art is explained by referring to the attached drawings as follows.

FIG. 1A illustrates a layout of a substrate receiving apparatus and a conveying robot according to a related art.

FIG. 1B illustrates a cross-sectional view of a substrate receiving apparatus according to a related art.

FIG. 1C illustrates a layout of a cassette-fixing clamp unit according to a related art.

Referring to FIG. 1A and FIG. 1B, a substrate receiving apparatus according to a related art includes a cassette 102 that receives a plurality of substrates 104, a stage 103 supporting the cassette 102, and at least one port 100 under the stage 103. In this case, the cassette 102 is able to receive about 20 substrates.

A conveying robot 101 selects one of various ports 100, approaches the cassette 102 on the selected port 100, and then loads/unloads the substrates 104 one by one for processing the substrate 104.

Referring to FIG. 1C, a fixing clamp 105 is used for fixing the cassette 102 mounted on the stage 103 (shown in FIG. 1B). A cylinder 106 is installed on the clamp 105 so as to move the clamp forward/backward in a direction of the arrow. A side roller 107 is installed on the clamp 105 so as to reduce friction with the cassette 102.

Once the cassette is fixed thereto by the clamp 105, the conveying robot 101 carries out the function of taking the substrates 104 out one by one to process the substrates 104.

FIG. 2A and FIG. 2B illustrate receiving statuses of the substrates 104 put in the cassette 102 according to a related art.

Referring to FIG. 2A, plates 202 are placed at both inner sides of a cassette 102 so as to support a substrate 104. The substrate 104 is placed on the plates 202. In this case, the plates 202 leave a predetermined interval from each other so that a robot arm 201 may enter a space between the substrates 104. Yet, a central portion of each of the substrates 104 droops downward due to its own weight.

Referring to FIG. 2B, an extent of the drooping increases as the substrate 104 is made to be thinner. Once the substrate 104 droops downward, the robot arm 201 advancing into the cassette for loading/unloading the substrate 104 fails to avoid touching another substrate. Hence, there is a chance the substrates may be damaged or for failure of the substrate.

In order to overcome such a problem there is a method for increasing an interval 206 between the upper and lower plates 202 or a length 207 of each of the plates 202. However, it is very expensive to modify all the cassettes used in a product line. Besides, it is troublesome to use a different cassette according to a thickness of the corresponding substrate 104.

SUMMARY OF THE INVENTION

Accordingly, the present invention is directed to a substrate receiving apparatus and method thereof that substantially obviates one or more problems due to limitations and disadvantages of the related art.

An advantage of the present invention is to provide a substrate receiving apparatus and method thereof that prevents substrate damage generated from the process of loading/unloading substrates on/from a cassette.

Another advantage of the present invention is to provide a substrate receiving apparatus and method thereof that provides a general cassette receive substrates therein regardless of various kinds of thickness of the substrates.

Additional features and advantages of the invention will be set forth in part in the description which follows and in part will be apparent from the description, or may be learned from practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate receiving apparatus according to the present invention includes a cassette having a plurality of plates inside so as to receive a plurality of substrates; a cassette loading unit uploading and downloading the cassette; a port supporting the cassette loading unit; and a plurality of auxiliary plates inserted inside the cassette from outside.

The plates may be arranged at both inner sides of the cassette so as to leave a predetermined interval from each other.

The auxiliary plates have a length that is substantially longer than the plates.

The auxiliary plates are placed substantially parallel with the plates, and a vertical interval between the auxiliary plates is about equal to that of the plates.

The substrate receiving apparatus further includes a plurality of auxiliary plate support bars arranged on the port.

Each of the auxiliary plate support bars is capable of revolving.

The substrate receiving apparatus further includes a plurality of clamps fixing the cassette to the cassette loading unit.

The substrate receiving apparatus further includes a plurality of cylinders moving the clamps forward and backward, respectively, and a plurality of side rollers that substantially reduce friction between the clamps and cassette.

In another aspect of the present invention, a substrate receiving method includes downloading a cassette so as to move substrates from plates of the cassette to auxiliary plates; unloading and loading the substrates on the auxiliary plates from/on the cassette; and uploading the cassette so as to move the substrates from the auxiliary plates to the plates of the cassette.

The method further includes fixing the cassette to a cassette loading unit having uploading and downloading functions.

The method further includes inserting the auxiliary plates inside the cassette from outside before the cassette is downloaded.

The auxiliary plates are inserted inside the cassette by revolving auxiliary plate support bars.

The auxiliary plates are inserted between the plates so as to be substantially parallel with the plates.

Namely, the present invention loads/unloads a substrate having been placed on the auxiliary plates to be substantially longer than the plates installed inside the cassette, thereby preventing substrate damage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to embodiments of the present invention, example of which is illustrated in the accompanying drawings. Wherever possible, the same reference numbers will be used throughout the drawings to refer to the same or like parts.

Figure 1A:
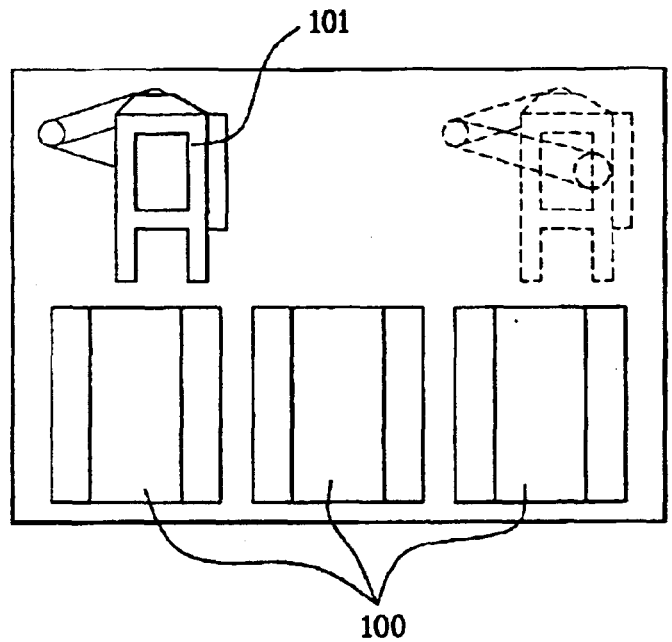
FIG. 1A illustrates a layout of a substrate receiving apparatus and a conveying robot according to a related art.
Figure 1B:
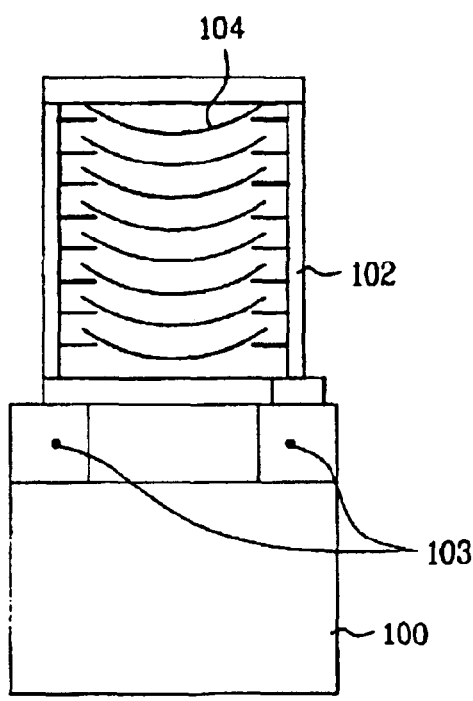
FIG. 1B illustrates a cross-sectional view of a substrate receiving apparatus according to a related art.
Figure 1C:
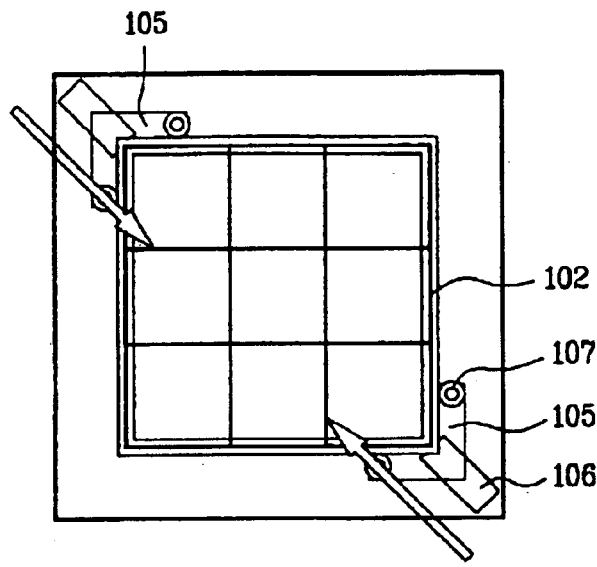
FIG. 1C illustrates a layout of a cassette-fixing clamp unit according to a related art.
Figure 2A:
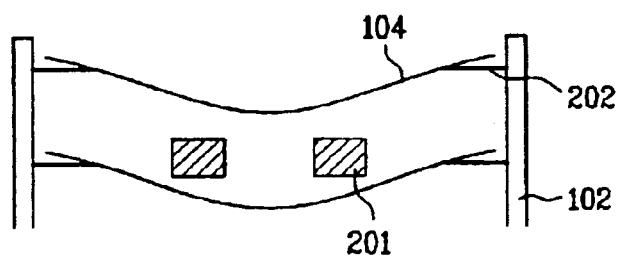
FIG. 2A and FIG. 2B illustrate receiving statuses of a substrate put in a cassette according to a related art.
Figure 2B:
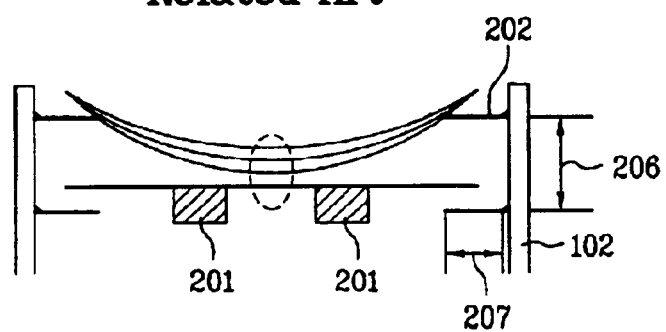
Figure 3A:
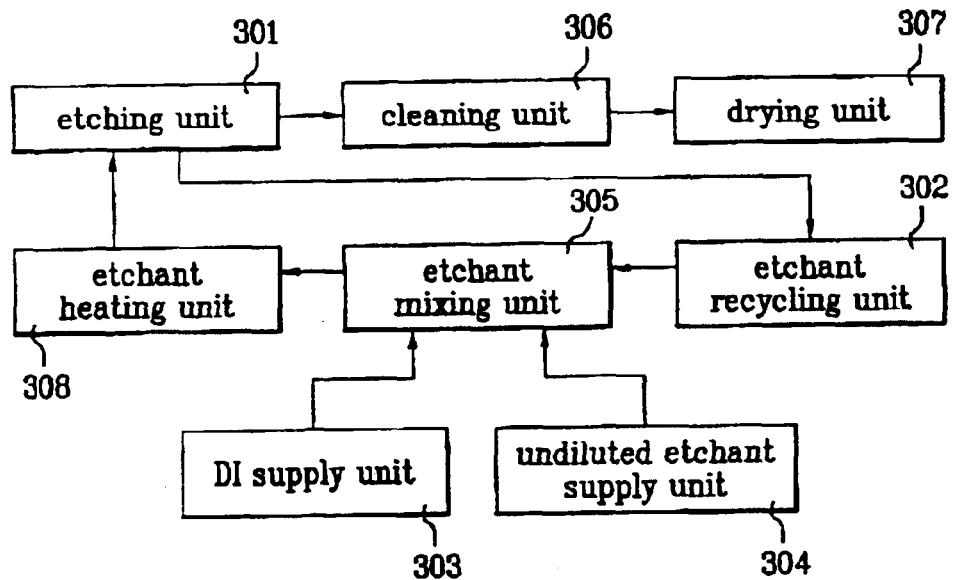
FIG. 3A illustrates a block diagram of a glass substrate etching apparatus according to the present invention.

FIG. 3A illustrates a block diagram of a glass substrate etching apparatus according to the present invention.

Figure 3B:
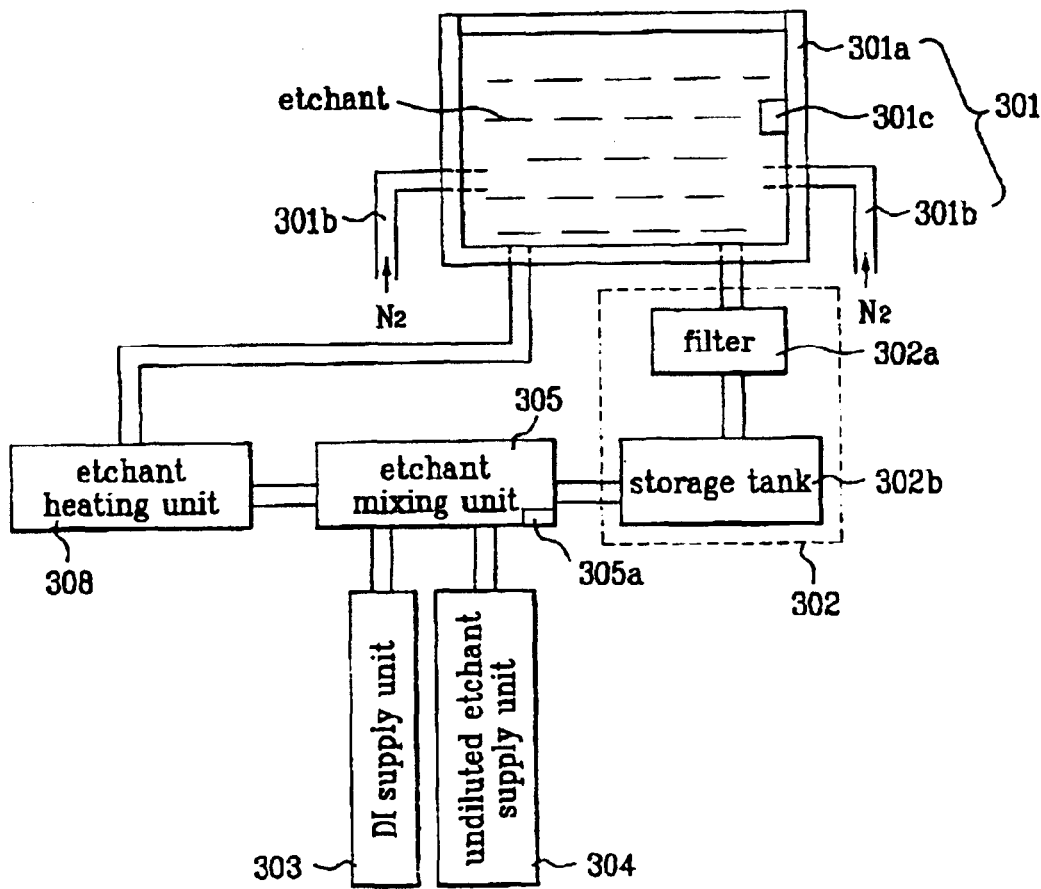
FIG. 3B illustrates a glass substrate etching apparatus according to the present invention.

FIG. 3B illustrates a glass substrate etching apparatus according to the present invention.

Referring to FIG. 3A, a glass substrate etching apparatus according to the present invention includes an etching unit 301, an etchant recycling unit 302 removing impurities from an etchant used by the etching unit 301 for etching a substrate so as to store the impurity-removed etchant. A deionized (DI) supply unit 303 provides deionized water. An undiluted etchant supply unit 304 supplies an undiluted etchant. An etchant mixing unit 305 mixes the DI water supplied from the DI supply unit 303, the undiluted etchant supplied from the undiluted etchant supply unit 304, and the impurity-removed etchant supplied from the etchant recycling unit 302 with each other. An etchant heating unit 308 heats the mixed etchant having been mixed by the etchant mixing unit 305.

Moreover, the glass substrate etching apparatus further includes a cleaning unit 306 removing the etchant remaining on the etched substrate using DI water and a drying unit 307 drying the cleaned substrate.

In this case, the etchant may include a HF solution.

The etching unit 301 includes an airtight container 301a and a supply pipe 301b connected to the container 301a through a pipe so as to supply nitrogen or oxygen.

Moreover, the etching unit 301 further includes a temperature measuring device 301c so as to measure a temperature difference generated from exothermic reaction between the substrate to be etched in the container 301a and the etchant. Namely, the etching reaction generates heat from the reaction between HF and silicon oxide contained in the substrate. The heat generated from the exothermic reaction is measured, whereby the extent of the etching can be known regardless of the concentration of the etchant or etching time. Hence, a thickness of a substrate and the temperature of the reaction heat according to a number of substrates are calculated, whereby the etching is stopped once the calculated temperature reaches a certain temperature. Therefore, the present invention provides an etched substrate having the uniform thickness.

The etchant recycling unit 302 includes a filter 302a removing impurities from the etchant used to etch the substrate and a storage tank 302b storing the impurity-removed etchant having been purified by the filter 302a, in this case, the filter 302a can be located at a rear end of the storage tank 302b so as to remove precipitates sunk in the storage tank 302b. At least one of the filters 302a can be formed at one or both of the front and rear ends of the storage tank 302b.

A concentration measuring device 305a is installed at one side of the etchant mixing unit 305 so as to measure a concentration inside the etchant mixing unit 305, and a pipe cooling water (PCW) coolant pipe (not shown in the drawing) may be formed at the other side of the etchant mixing unit 305 so as to uniformly maintain a temperature of the etchant.

The concentration of the etchant such as HF or the like is uniformly maintained uniformly using the concentration measuring device 305a. This is because an etching time depends on the concentration of the etchant as well as a bubble pressure by nitrogen or oxygen bubbles. For instance, the etching time is lengthened if the concentration of the etchant is low. Stains are formed on a surface of the glass substrate due to irregular etching by abrupt exothermic and chemical reaction if the concentration is high.

Moreover, the etching unit 301, etchant heating unit 308, etchant mixing unit 305, and etchant recycling unit 302 are connected to each other through pipes so as to allow the etchant flow therein. Besides, at least one pump can be formed between the pipes so as to allow the etchant to move therein.

A substrate receiving apparatus for receiving the thin substrates in a liquid crystal display and a method thereof according to the present invention are explained in detail by referring to the attached drawings as follows.

Figure 4A:
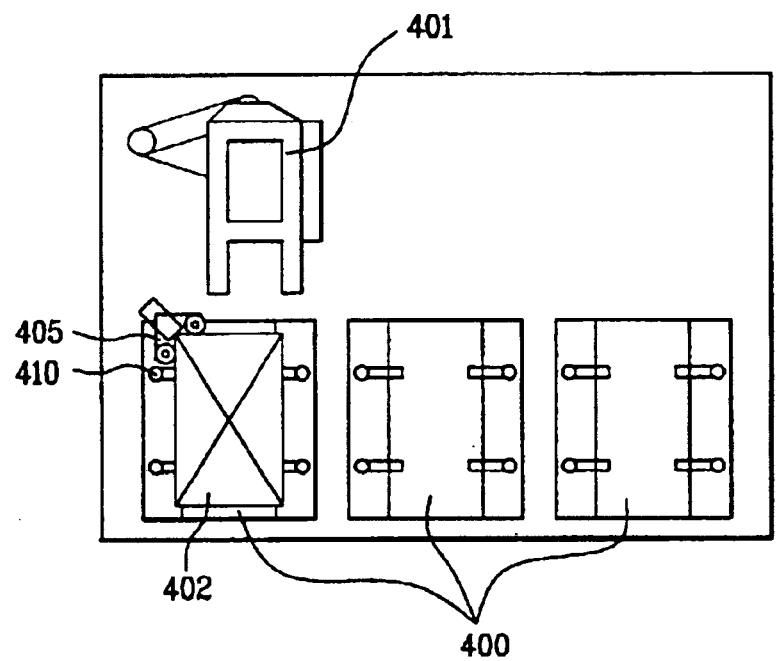
FIG. 4A illustrates a layout of a substrate receiving apparatus and a conveying robot according to the present invention.

FIG. 4A illustrates a layout of a substrate receiving apparatus and a conveying robot according to the present invention.

Figure 4B:
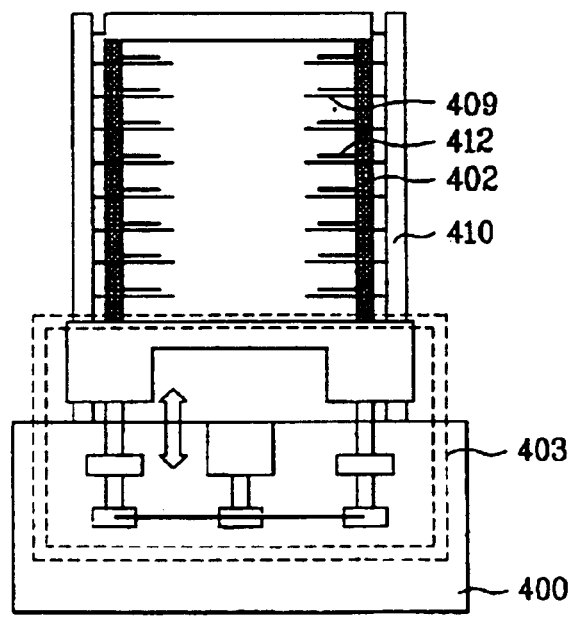
FIG. 4B illustrates a cross-sectional view of a substrate receiving apparatus according to the present invention.

FIG 4B illustrates a cross-sectional view of a substrate receiving apparatus according to the present invention.

Figure 4C:
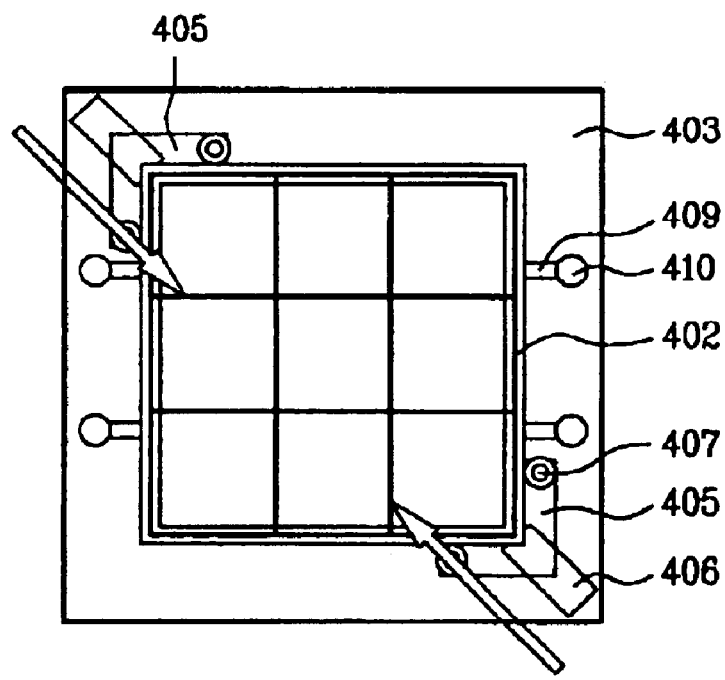
FIG. 4C illustrates a layout of a substrate receiving apparatus according to the present invention.

FIG. 4C illustrates a layout of a substrate containing apparatus according to the present invention.

Referring to FIG. 4A and FIG. 4B, a substrate containing apparatus according to the present invention includes a cassette 402 having plates 412 to support a plurality of substrates inside the apparatus. A cassette loading unit 403 uploading/downloading the cassette 402, a port 400 supporting the cassette loading unit 403, and auxiliary plate support bars 410 placed at both sides of the cassette so as to support auxiliary plates 409 inserted inside the cassette 402 from outside.

Referring to FIG. 4C, the substrate containing apparatus according to the present invention further includes clamps 405 fixing the cassette 402 on the cassette loading unit 403, cylinders 406 moving the clamps 405 forward/backward, and side rollers 407 for substantially reducing friction between the clamps 405 and the cassette 402.

In this case, the plates 412 are arranged at both inner sides of the cassette 402 so as to leave a uniform predetermined interval from each other and the auxiliary plates 409 are attached to lateral sides of the auxiliary plate support bars 410 so as to provide approximately the same vertical interval between the plates 412 from each other.

Hence, the auxiliary plates 409 are supported by the auxiliary plate support bars 410 arranged on the port 400, and can be inserted in the cassette 402 from outside by the revolving auxiliary plate support bars 410.

The conveying robot arm 401 approaches the above-constituted substrate receiving apparatus according to the present invention so as to unload/load the substrates from/on the cassette 402 one by one for the processing of the substrates.

Figure 5A:
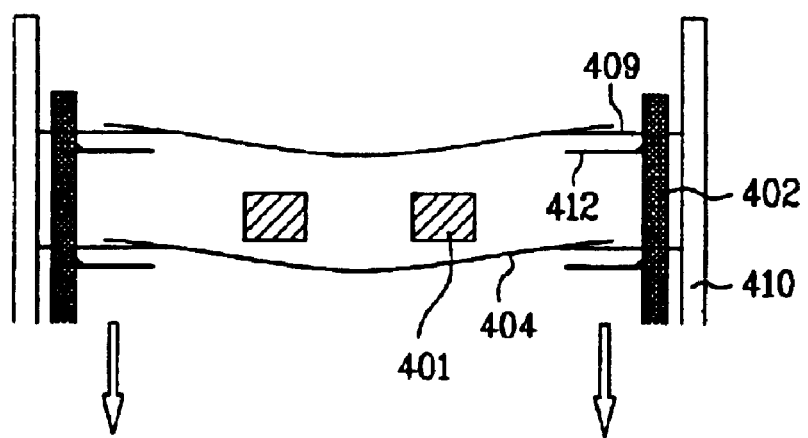
FIG. 5A illustrates a cross-sectional view of a substrate receiving apparatus according to the present invention for explaining a status of received substrates.

FIG. 5A illustrates a cross-sectional view of a substrate receiving apparatus according to the present invention for explaining a status of received substrates in the cassette.

Figure 5B:
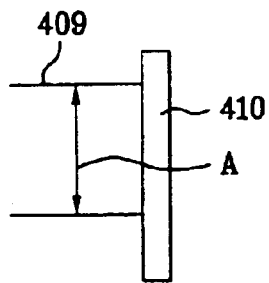
FIG. 5B illustrates a cross-sectional view of auxiliary plates and an auxiliary plate support bar of a substrate receiving apparatus according to the present invention.

FIG. 5B illustrates a partial cross-sectional view of auxiliary plates and an auxiliary plate support bar of a substrate receiving apparatus according to the present invention.

Figure 5C:
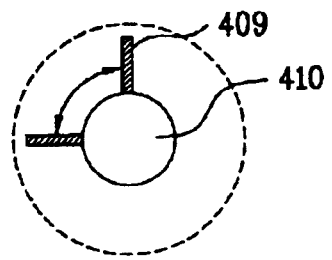
FIG. 5C illustrates a layout of auxiliary plates and an auxiliary plate support bar of a substrate receiving apparatus according to the present invention.

FIG. 5C illustrates a layout of auxiliary plates and an auxiliary plate support bar of a substrate receiving apparatus according to the present invention.

Referring to FIG. 5A, when a conveying robot arm 401 enters a cassette 402 for loading/unloading substrates 404, there is less chance for the substrates 404 to be damaged by the robot arm 401 since the substrates are placed on auxiliary plates 409. This is because each of the substrates 404 droops to a substantially lesser extent when the substrates 404 are placed on the auxiliary plates 409 substantially longer than the plates 412.

The present invention includes the above-explained auxiliary plates 409, thereby enabling a thin substrate to be loaded/unloaded a thin substrate without causing substantially any damage on the thin substrate. The thickness of the substrate may be about 0.7T (mm), 0.63T (mm), or 0.5T (mm).

Referring to FIG. 5B and FIG. 5C, the auxiliary plates 409 are attached to sides of the auxiliary plate support bars 410 so as to leave the substantially the same vertical interval A approximately equal to the vertical interval of the plates 412 from each other, and are inserted inside the cassette 402 by about 900 revolutions of the auxiliary plate support bars 410. Hence, the substrates can be received using the previous cassette 402 without any considerable alteration of the cassette 402 in accordance with a corresponding thickness of the substrate 404.

A method of receiving a substrate using a substrate receiving apparatus according to the present invention is explained as follows.

Figure 6A:
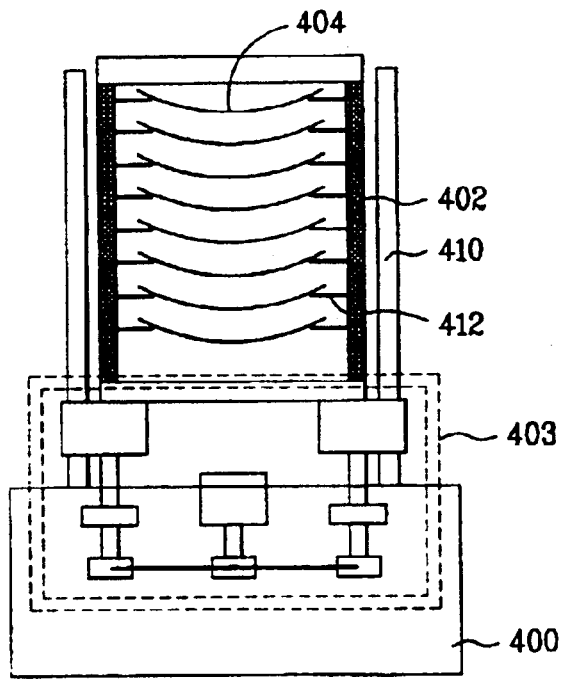
FIGS. 6A to 6C illustrate cross-sectional views of a method of receiving a substrate according to the present invention.
Figure 6B:
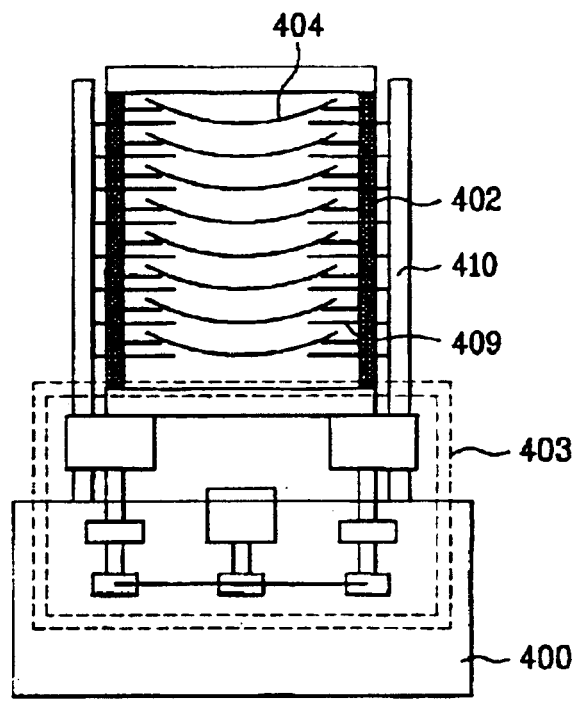
Figure 6C:
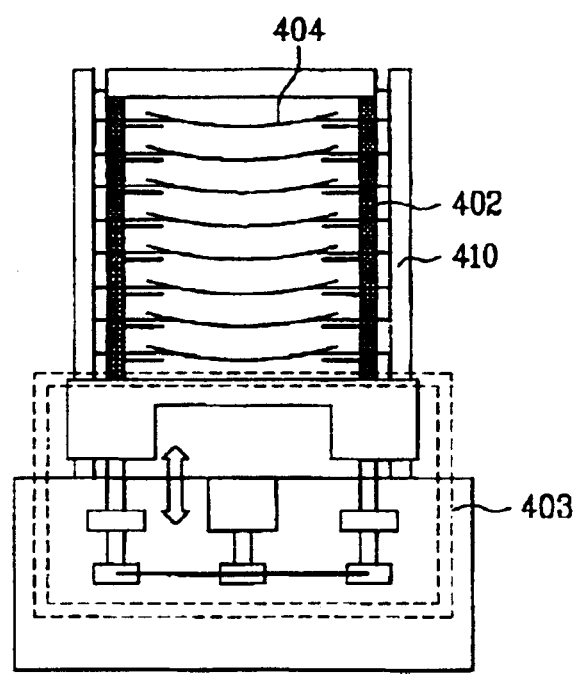

FIGS. 6A to 6C illustrate cross-sectional views of a method of receiving a substrate according to the present invention.

Figure 7A:
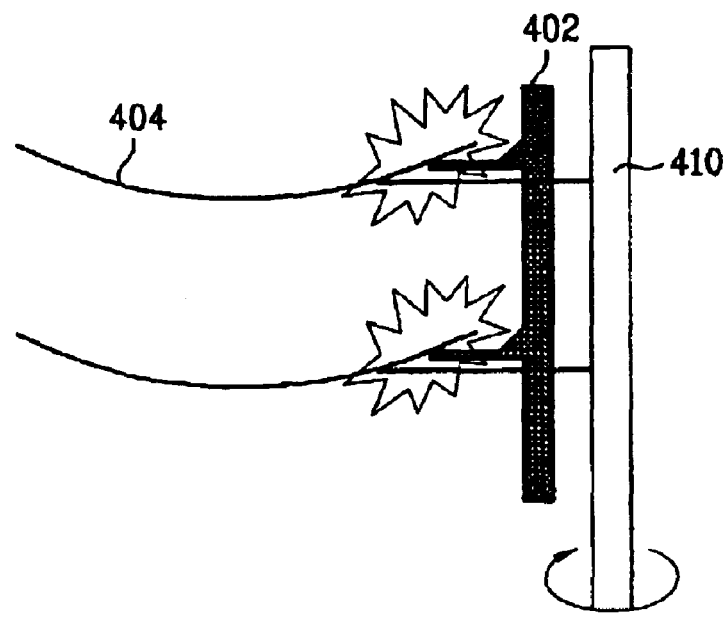
FIG. 7A and FIG. 7B illustrate diagrams for explaining the operation of an auxiliary plate of a substrate receiving apparatus according to the present invention.
Figure 7B:
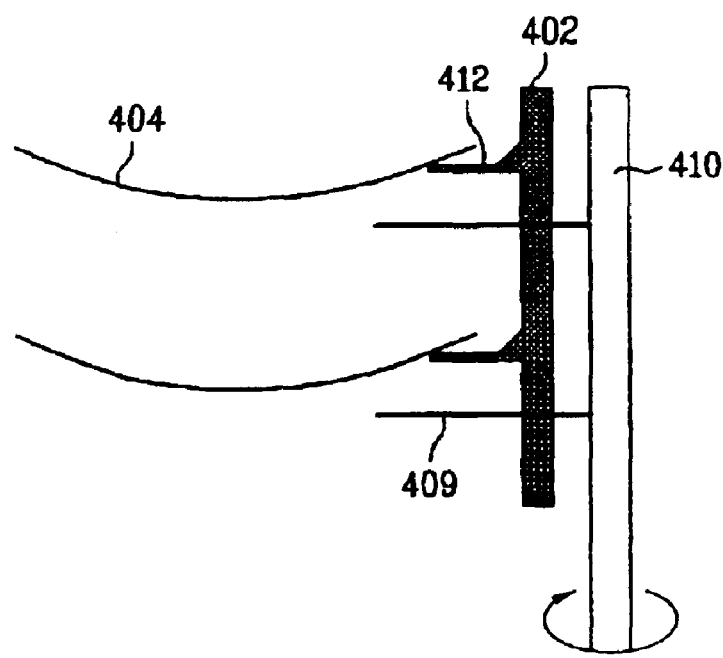

FIG. 7A and FIG. 7B illustrate diagrams for explaining the operation of an auxiliary plate of a substrate receiving apparatus according to the present invention.

Referring to FIG. 6A, a cassette 402 receiving substrates 404 inside is mounted on a cassette loading unit 403 having uploading/downloading functions, and then fixed thereto using clamps 405. The clamps 405 are arranged at corners of the cassette 402. In this case, the substrates 404 are placed on plates inside the cassette 402.

Referring to FIG. 6B, auxiliary plate support bars 410 at both sides of the cassette 402 are revolved by about 900 so that auxiliary plates 409 are inserted inside the cassette 402. In this case, the auxiliary plates 409 are placed in parallel with each other between the plates 412 inside the cassette 402.

Referring to FIG. 6C, the cassette 402 is downloaded using the cassette loading unit 403. In this case, as the cassette 402 goes down, the substrates having been put on the plates 412 are placed on the auxiliary plates 409. Since the auxiliary plates 409 are substantially longer than the plates 412, the extent of drooping of each of the substrates 404 is reduced.

A conveying robot arm 401 enters the cassette 402 so as to unload the substrates 404 on the auxiliary plates 409 from the cassette 402 to process of the substrates 404. Once the process of the substrates is completed, the robot arm 401 loads the substrates inside the cassette 402 again. In this case, the substrates are placed on the auxiliary plates 409.

Subsequently, the cassette loading unit 403 is driven so as to upload the cassette 402. In this case, as the plates 412 go upward, the substrates 404 having been placed on the auxiliary plates 409 are placed on the plates 412.

Thereafter, the cassette 402 is transferred to another port for the next process.

Meanwhile, FIG. 7A and FIG. 7B illustrate the case where the auxiliary plates 409 are inserted inside the cassette 402 by the revolving auxiliary plate support bars 410. The auxiliary plates 409, which are inserted to be near to the plates 412, as shown in FIG. 7A, collide with the substrates 404. Hence, the auxiliary plates 409, as shown in FIG. 7A, should be inserted in proper positions between the plates 412 to avoid collision.

Accordingly, the substrate receiving apparatus in a liquid crystal display device and method thereof according to the present invention have the following advantages or effects.

First, the present invention uses auxiliary plates longer than the plates supporting the substrates inside the cassette, thereby preventing substrate damage from occurring when the substrates are loaded/unloaded on/from the cassette.

Second, the present invention uses the related art cassette without replacing or altering the cassette in accordance with the corresponding thickness of the substrate, thereby minimizing the process cost and time.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A substrate receiving apparatus comprising:
   a cassette having a plurality of plates inside so as to receive a plurality of substrates;
   a cassette loading unit uploading and downloading the cassette;
   a port supporting the cassette loading unit; and
   a plurality of auxiliary plates inserted inside the cassette from outside the cassette.

2. The apparatus of claim 1, wherein the plates are arranged at both inner sides of the cassette so as to leave a predetermined interval from each other.

3. The apparatus of claim 1, wherein the auxiliary plates are substantially longer than the plates.

4. The apparatus of claim 1, wherein the auxiliary plates are placed substantially parallel with the plates.

5. The apparatus of claim 1, wherein a vertical interval between the auxiliary plates is about equal to that of the plates.

6. The apparatus of claim 1, further comprising a plurality of auxiliary plate support bars arranged on the port.

7. The apparatus of claim 6, wherein each of the auxiliary plate support bars are capable of revolving.

8. The substrate containing apparatus of claim 1, further comprising a plurality of clamps fixing the cassette to the cassette loading unit.

9. The substrate containing apparatus of claim 8, further comprising:
   a plurality of cylinders moving the clamps forward and backward; and
   a plurality of side rollers substantially reducing friction between the clamps and cassette.

10. The substrate containing apparatus of claim 1, wherein the plurality of substrates include glass.

* * * * *